United States Patent [19]

Sumihiro

[11] Patent Number: 4,812,898
[45] Date of Patent: Mar. 14, 1989

[54] ELECTRONICALLY PROGRAMMABLE AND ERASABLE MEMORY DEVICE HAVING FLOATING GATE ELECTRODE WITH A UNIQUE DISTRIBUTION OF IMPURITY CONCENTRATION

[75] Inventor: Naotaka Sumihiro, Tokyo, Japan
[73] Assignee: NEC Corporation, Japan
[21] Appl. No.: 876,897
[22] Filed: Jun. 20, 1986
[30] Foreign Application Priority Data
Jun. 21, 1985 [JP] Japan .................... 60-135583
[51] Int. Cl.⁴ .................... H01L 29/78; H01L 29/04; G11C 11/34; G11C 7/00
[52] U.S. Cl. .................... 357/23.5; 365/185; 365/182; 365/218; 357/59
[58] Field of Search .............. 365/185; 357/23.5, 23.6, 357/59

[56] References Cited
U.S. PATENT DOCUMENTS
4,328,565  5/1982  Harari .................... 365/185
4,435,786  3/1984  Tickle .................... 365/185
4,688,078  8/1987  Hseih .................... 365/185

FOREIGN PATENT DOCUMENTS
0021071  2/1984  Japan .................... 357/23.5
0021072  2/1984  Japan .................... 357/23.5

*Primary Examiner*—Terrell W. Fears
*Assistant Examiner*—Melissa J. Koval
*Attorney, Agent, or Firm*—Laff, Whitesel, Conte & Saret

[57] ABSTRACT

An electrically programmable and erasable memory device is disclosed, in which carriers such as electrons transfer between a floating gate electrode made of polycrystalline silicon and a drain region through a thin insulating film portion provided on a part of the drain region by an electric field induced in the thin insulating film portion. The floating gate electrode has such an impurity concentration distribution that the concentration of a portion adjacent to the thin insulating film portion is lower than the concentration of the remaining portion.

3 Claims, 5 Drawing Sheets

ELECTRONICALLY PROGRAMMABLE AND ERASABLE MEMORY DEVICE HAVING FLOATING GATE ELECTRODE WITH A UNIQUE DISTRIBUTION OF IMPURITY CONCENTRATION

BACKGROUND OF THE INVENTION

The present invention relates to an electrically programmable and erasable memory device having a floating gate electrode (hereinafter abbreviated as EEPROM).

Widely used EEPROMs are relied upon Fowler-Nordheim tunneling phenomenon, in which carriers such as electrons are injected into the floating gate electrode from the drain region and injected from the floating gate electrode back to the drain region through a thin insulating film provided on a part of the drain region. This technology is disclosed in U.S. Pat. No. 4,203,158. In the programming operation, that is, writing operation, the P-type substrate and the control gate electrode are supplied with a , reference potential, and the N-type source region maintains floating state or is applied with low positive potential such as +5 volts. High positive potential such as +20 volts are applied to the N-type drain region so that a high electric field is produced in the thin insulating film made of silicon oxide on the part of the drain region by capacitive coupling and electrons are injected from the floating gate electrode to the drain region through the thin insulating film by Fowler-Nordheim tunneling mechanism. Consequently, positive carriers are accumulated in the floating gate electrode. In the erasing operation, for example, the semiconductor substrate, the source region and the drain region are made to take ground potential, and by applying a high positive potential such as +20 volts to the control gate electrode a high electric field, which is the opposite direction from the writing operation mentioned above, is produced in the thin insulating film and electrons are emitted from the drain region to the floating gate electrode through the thin insulating film by Fowler-Nordheim tunneling so that negative carriers, that is, electrons are accumulated in the floating gate electrode. The writing operation and the erasing operation mentioned above can be replaced with each other. In the reading operation, an adequate voltage is applied to the region between the source and drain regions of the EEPROM is ON state or OFF state, as done in usual nonvolatile memory cells. Therefore, in order to read data correctly in the reading operation, the floating gate electrode must store a sufficient amount of positive or negative carriers so as to set the threshold voltage of the programmed EEPROM to a predetermined level.

In EEPROM, the writing and erasing operations are repeatedly carried out, with high electrid fields of opposite polarities being repeatedly applied to the thin insulating film. Therefore, the thin insulating film is deteriorated. In this case, Fowler-Nordheim tunneling flowing of carriers cannot be desirably conducted under the normal operating conditions, and once stored carriers in the floating gate electrode are apt to leak through the deteriorated thin insulating film. Then, sufficient amount of carriers cannot be stored and the threshold voltage cannot be set at a predetermined value. Consequently, the correct reading cannot be expected The fatigue phenomenon of the thin insulating film by repeated application of alternative high electric fields is related to electron traps dispersed in the thin insulating film. The formation of the electron traps is due to undesirable minute particles or dusts produced in the process step of forming the thin insulating film. However, this drawback has been recently avoided by introducing super-clean process technology. In the recent EEPROM, the fatigue phenomenon of the thin insulating film does not happen till the repeated applications reach about $10^5$ times. A stable EEPROM which can withstand such an enormous repetition of voltage application is required.

SUMMARY OF THE INVENTION

Accordingly, an object of the present invention is to provide an EEPROM which can store a sufficient amount the writing and erasing operations are repeated more than $10^5$ times.

Another object of the present invention is to provide an effective method of manufacturing the EEPROM mentioned above.

The inventor of the present invention has discovered by extensive experiments that the fatigue phenomenon in the thin insulating film is caused by impurities such as boron, phosphorus or arsenic doped in the floating gate electrode of polycrystalline silicon. Namely, the impurities are introduced from the floating gate electrode into the thin insulating film and form electron traps therein.

According to the present invention, there is provided an EEPROM comprises a semiconductor substrate of one conductivity type, and source and drain regions of the opposite conductivity type formed in a major surface of the substrate. A channel region is positioned in the major surface of the substrate between the source and drain regions. A floating gate electrode is made of polycrystalline silicon, and a first gate insulating film is positioned between the floating gate electrode and the major surface of the substrate. A second gate insulating film is formed on the floating gate electrode, and a control gate electrode is formed on the second gate insulating film. The first gate insulating film includes a partially thin portion above a part of the drain region, and the floating gate electrode has a portion of a lower impurity concentration than the remaining portion thereof at a location adjacent to the thin portion. Through the thin portion of the first gate insulating film the tunneling carriers flow in both writing and erasing operations, and electron traps produced by dopants diffused from the floating gate electrode must be reduced as mentioned before. Therefore, the impurity concentration of the portion of the floating gate electrode adjust to the thin portion of the first gate insulating film is favorably $10^{19}$ cm$^{-3}$ or less. On the other hand, to avoid potential difference produced in the portion in writing and erasing operations, the impurity concentration thereof is favorably $10^{18}$ cm$^{-3}$ or more. The second gate insulating film of silicon oxide is generally formed by converting the upper surface of the floating gate electrode by thermal treatment under oxidizing atomosphere. Therefore, to form a fine and high insulating nature film the impurity concentration of the upper surface of the floating gate electrode is favorably $10^{20}$ cm$^{-3}$ or more On the other hand, to avoid impurity diffusion from the upper surface to the portion of the lower surface, the impurity concentration in the upper surface of the floating gate electrode is favorably $10^{21}$ cm$^{-3}$ or less. The floating gate electrode may be formed by patterning a first polycrystalline film having a low impurity concentration of, for example, $10^{18}$–$10^{19}$ cm$^{-3}$ and a second polycrystalline film provided on the first polycrystalline film and having a high impurity concentration of, for example, $10^{20}$–$10^{21}$ cm$^{-3}$. In consideration of the precise etching of polycrystalline silicon films, the formation of the second gate insulating film with good nature and the prevention of undesirable diffusion of impurities, each thickness of the first and second polycrystalline silicon films ranges favorably from 500 Å to 3000 Å. Boron, phosphorus or arsenic may be used as the impurity.

DESCRIPTION OF THE PRIOR ART

Figure 1A:
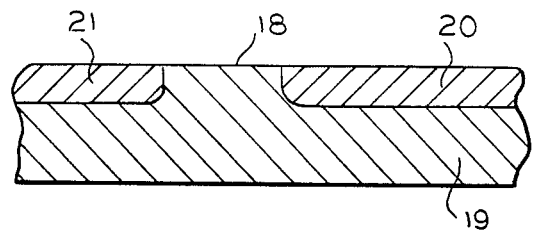
FIGS. 1A to 1D are cross-sectional view showing process steps manufacturing an EEPROM in the prior art.
Figure 1B:
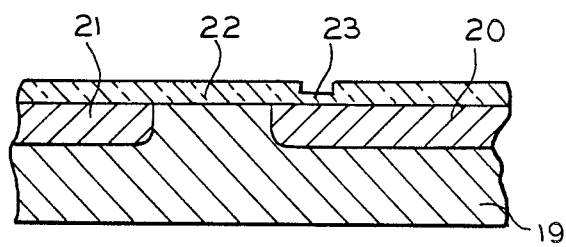
Figure 1C:
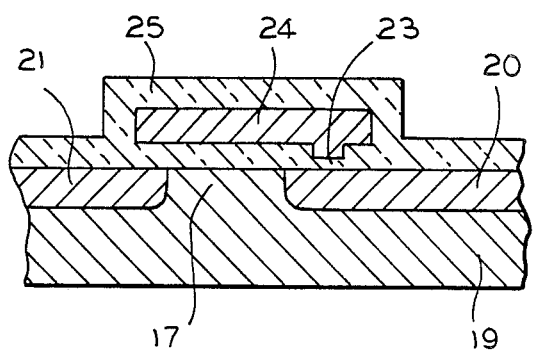
Figure 1D:
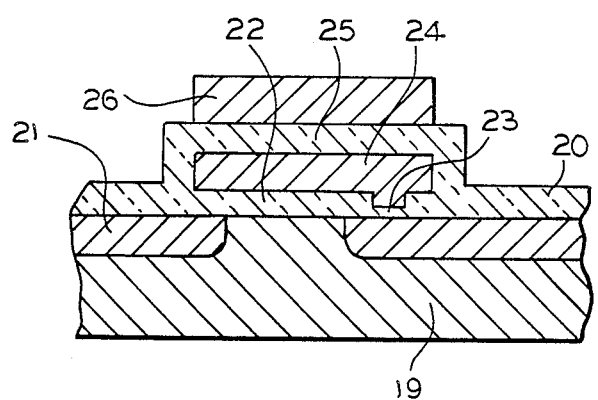

Referring to FIGS. 1A to 1D, an N-type drain region 20 and an N-type source region 21 are formed in a major surface 18 of a P-type silicon substrate 19 (FIG. 1A). Next, a first gate insulating film 22 made of silicon oxide and having 500 Å–1000 Å thick is formed by thermal oxidation method. Then, a portion of the film on a part of the drain region 20 is etched away to expose the part of the drain region by well-known photo-lithography technology. A thin film 23 of 100 Å–150 Å thick is newly formed on the part of the drain by thermal oxidation method (FIG. 1B). Through the thin film 23, carriers such as electrons flow in the writing and erasing operations. Thereafter, a first N-type polycrystalline silicon containing N-type impurity such as phosphorus is entirely deposited. The impurity concentration of the first N-type, polycrystalline silicon is $10^{20}$ cm$^3$ or more in its all parts. A floating gate electrode 24 is formed by patterning the first N-type polycrystalline silicon. As shown in FIG. 1C, the floating gate electrode 24 covers completely the thin film 23 and extends on the first gate insulating film 22 above a channel region 17 and end sections of the source and drain regions. Then, a second gate insulating film 25 of silicon oxide is formed by converting the upper portion of the floating gate electrode through thermal oxidation method. Next, as shown in FIG. 1D, a control gate electrode 26 is formed from a second N-type polycrystalline silicon layer and provided on the second gate insulating film 25.

In the prior art structure, the whole portions of the floating gate electrode is made of high impurity concentration layer Therefore, the impurity is easily introduced into the thin film 23 from the floating gate electrode, and apt to produce many electron traps therein. Consequently, sufficient amount of carriers cannot be stored after repeating operations of writing and erasing, and therefore, correct reading cannot be expected.

Figure 5:
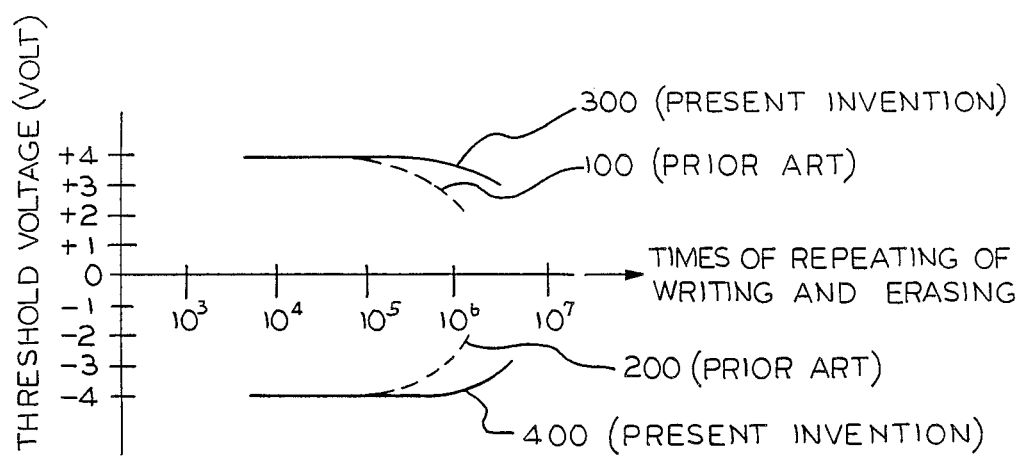
FIG. 5 is a diagram showing the variations of the threshold voltage of EEPROM after repeating operations of writing and erasing, in both cases of the embodiment of the present invention and the prior art structure.
Figure 6:
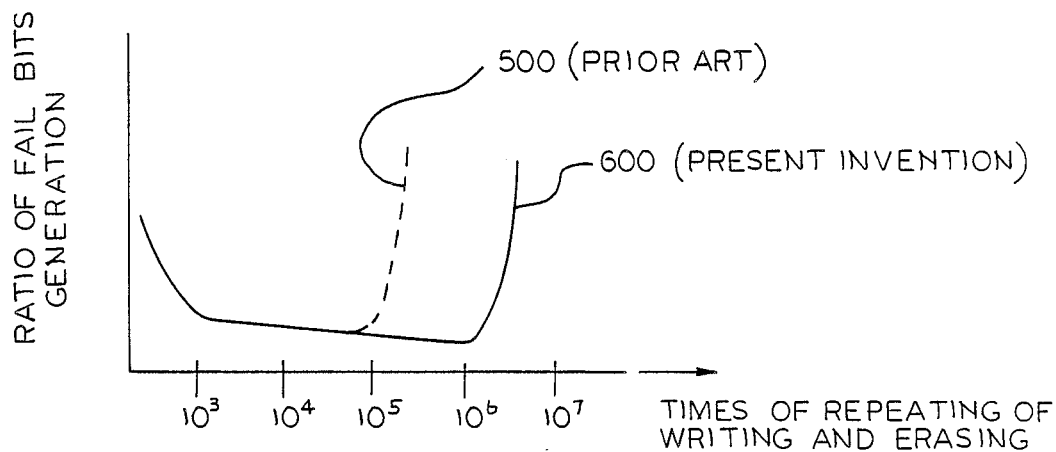
FIG. 6 is a diagram showing the ratio of fail bits (EEPROM cells) generation after repeating operations of writing and erasing, in both cases of the embodiment of the present invention and the prior art structure.

Referring to FIG. 5, curves 100, 200 represents the variation of the threshold voltage in the prior art structure. More particularly, after $10^5$ times or more of the repetitions have been conducted, when electrons are injected in the floating gate from the drain region under the normal conditions, for example, by applying +20 volts to the control gate electrode during $10^{-3}$ second, the obtained thresholed voltages shift from the designed value +4 volts as represented by curve 100. Also, after $10^5$ times or more of the repetitions has been conducted, when electrons are rejected from the floating gate electrode to the drain region under the normal conditions, for example, by applying +20 volts to the drain region during $10^{31\ 3}$ second, the obtained threshold voltages shift from the designed value −4 volts as represented by curve 200. Therefore, as shown by curve 500 in FIG. 6, the ratio of fail bits generation is rapidly increased in the prior art after writing and erasing repeating operations of $10^5$ times.

DETAILED DESCRIPTION OF THE EMBODIMENT

Figure 2A:
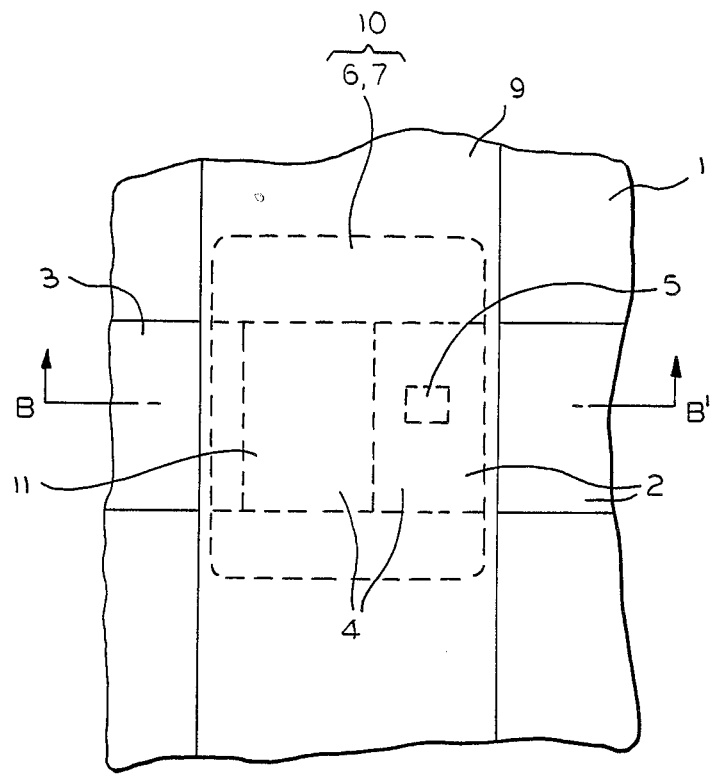
FIG. 2 is a plan view showing an EEPROM of an embodiment of the present invention.
FIG. 2B is a cross-sectional view taken along line B—B' in FIG. 2A as viewed in the direction of arrows.
Figure 2B:
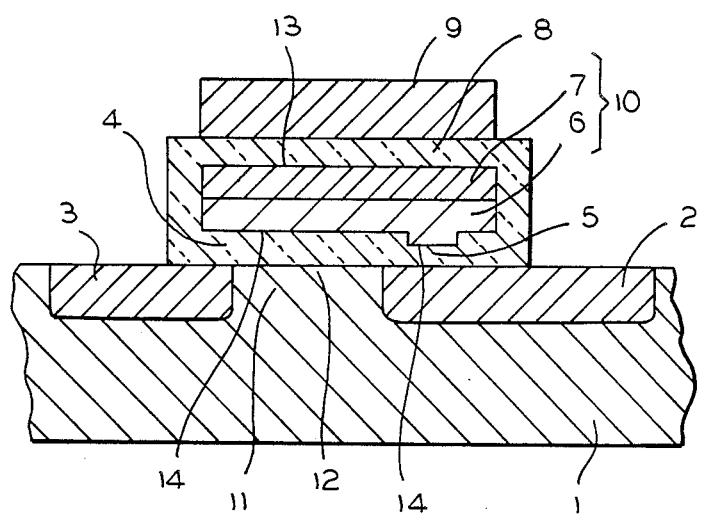
Figure 4:
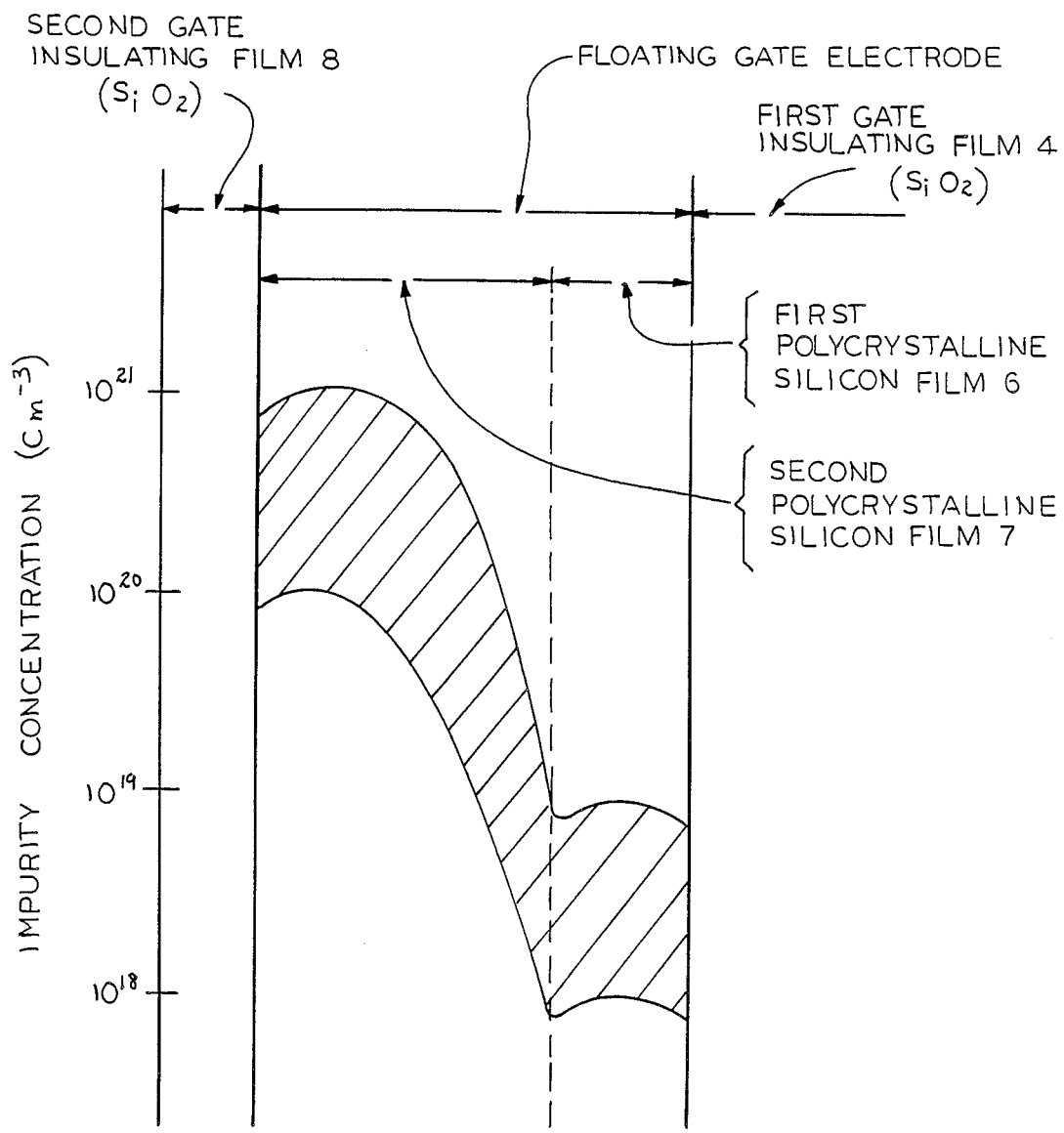
FIG. 4 is a diagram showing the distribution of the impurity concentration in the floating gate electrode of the embodiment.

Referring to FIGS. 2A and 2B, and N$^+$-type drain region 2 and an N$^+$-type source region 3 are formed in a major surface 12 of a P-type silicon substrate 1 by interposing a channel region 11. A first gate insulating film 4 made of silicon oxide and having 500 Å–1000 Å thick is formed on an entire channel region and extends on source and drain regions. In the first gate insulating film, a thin film portion 5 of 100 Å–150 Å thick having the square plan figure of 1.5×1.5 μm is provided on a part of the drain region 2. A floating gate electrode 10 is provided on the first gate insulating film 4 including the thin film portion, 5. A control gate electrode 9 made of doped polycrystalline silicon is provided on the floating gate electrode 10 via a second gate insulating film 8 of 800 Å thick. In the writing and erasing operations, carriers such as electrons flow between the floating gate electrode and the drain region through the thin film portion 5 of the first gate insulating film by strong electric field induced in the thin film portion 5. In the embodiment, the floating gate electrode 10 consists of a first polycrystalline silicon film 6 having a low impurity concentration and a second polycrystalline silicon film 7 having high impurity concentration such that the lower surface 14 of the floating gate electrode 10 attached to the first gate insulating film 4 including the thin film portion 5 becomes the impurity such as phosphorus concentration of $10^{18}$–$10^{19}$ cm$^{-3}$, for example, 5×$10^{18}$, and the upper surface 13 of the floating gate electrode 10 attached to the second gate insulating film 8 becomes the impurity such as phosphorus concentration $10^{20}$–$10^{21}$, for example, 2×$10^{20}$. The distribution of the impurity concentration in the floating gate electrode of the embodiment is represented by hatching in FIG. 4. Such a high impurity concentration at the upper surface can form a fine second gate insulating film 8 having good insulating nature by thermal oxidation in oxidizing atmosphere. On the other hand, the lower surface 14 attached to the thin film portion 5 has a low impurity concentration. Therefore, the amount of impurities introduced from the floating gate electrode into the thin film 5 is small, and electron traps induced by the introduced impurities can be negligible. Consequently, even if repeatings of writing and erasing operations have been conducted, carriers can be sufficiently flown through the thin film portion and carriers can be surely stored in the floating gate electrode.

Referring to FIG. 5, curves 300, 400 represents the variation of the threshold voltage in the embodiment. After $10^5$ times or more of the repeatings has been conducted, when electrons are injected in the floating gate electrode from the drain region through the thin film portion 5 under the normal conditions, for example, by applying +20 volts to the control gate electrode during $10^{-3}$ second, the obtained threshold voltages maintain substantially constant value of +4 volts as represented by curve 300. Also, after $10^5$ times or more of the repeatings have been conducted, when electrons are rejected from the floating gate electrode to the drain region through the thin film portion under the normal conditions, for example, by applying +20 volts to the drain regions during $10^{-3}$ second, the obtained threshold voltages maintain substantially constant value of −4 volts as represented by curve 400. Consequently, as represented by curve 600 in FIG. 6, the ratio of fail bits generation is not increased in the embodiment even after writing and erasing repeating operations of $10^5$ times, and is rapidly increased after the repeating operations being over $10^6$ times.

Next, an embodiment of method of manufacturing the EEPROM shown in FIGS. 2A, 2B will be explained by referring FIGS. 3A to 3D.

Figure 3A:
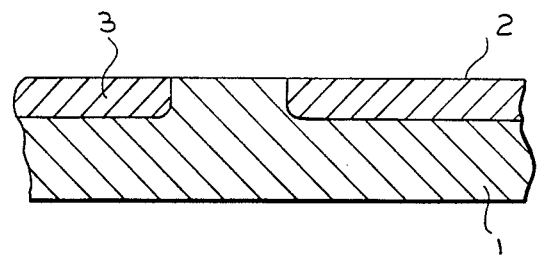
FIGS. 3A to 3D are cross-sectional view showing process steps for manufacturing the embodiment of FIGS. 2A and 2B.
Figure 3B:
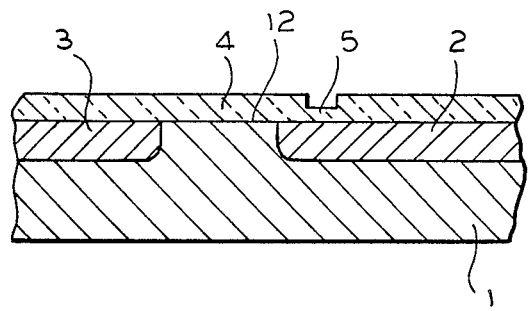
Figure 3C:
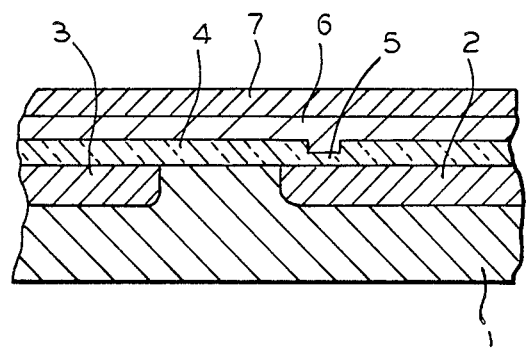
Figure 3D:
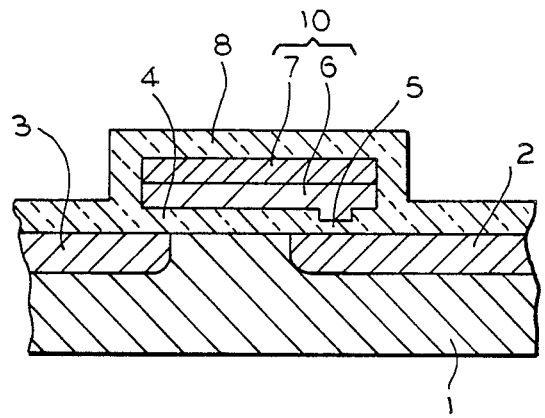

The source region 3 and drain region 2 are formed in the P-type silicon substrate 1 by introducing arsenic through an ion-implantation method (FIG. 3A). Next, the first gate insulating film 4 made of silicon oxide and having 500–1000 Å thick is formed on the major surface 12 of the substrate 1 by thermal oxidation method. The source and drain regions may be formed after formation of the film 4 by introducing arsenic ion through the film 4. Then, an aperture is formed in the first gate insulating film 4 to expose a part of the drain region 2, and the thin insulating film 5 made of silicon oxide and having 100–150 Å thick is newly formed on the part of the drain region within the aperture by thermal oxidation method (FIG. 3B). Thereafter, as shown in FIG. 3C, a first polycrystalline silicon film 6 containing phosphorus of $10^{19}$ cm$^{-3}$ or less and having 500 Å–3000 Å thick is entirely formed by CVD method on the first gate insulating film 4 including the thin insulating film 5, and a second polycrystalline silicon film 7 containing phosphorus of $10^{20}$–$10^{21}$ cm$^{-3}$ and having 500 Å–3000 Å thick is formed by CVD method on the first polycrystalline silicon film 6. Then, the second and first polycrystalline silicon films are selectively etched to form the floating gate electrode 10, and the second gate insulating film 8 is grown by converting the upper portion of the second polycrystalline silicon film 8 to silicon oxide through heat treatment under oxidizing atmosphere (FIG. 3D). Next, by forming the control gate electrode from an N-type polycrystalline silicon layer, the EEPROM shown in FIGS. 2A, 2B is obtained. In FIGS. 2 and 3, a field insulator, a passivation film and lead-out wiring layers connected to source, drain region are not shown.

What is claimed is:

1. An electrically programmable and erasable memory device comprising a semiconductor substrate of one conductivity type, source and drain regions of the opposite conductivity type formed in a major surface of said substrate, a channel region positioned in said major surface of said substrate between said source and drain regions, a floating gate electrode made of polycrystalline silicon, a first gate insulating film positioned between said floating gate electrode and said major surface of said substrate, a second gate insulating film formed on said floating gate electrode, and a control gate electrode formed on said second gate insulating film, said first gate insulating film including a partially thin portion above a part of said drain region, and said floating gate being a double film structure including a first polycrystalline silicon film having a low impurity concentration and being attached at its bottom surface to said first gate insulating film including said thin portion, and a second polycrystalline silicon film having a higher impurity concentration than said first polycrystalline silicon film, said second polycrystalline silicon film being formed on said first polycrystalline silicon film and being attached at its upper surface to said second gate insulating film, said first and second polycrystalline silicon films having the same plan shape and overlying parts of said source and drain regions and entire parts of said channel region, whereby a sufficient amount of carriers can be stored in said floating gate electrode even after writing and erasing operations have been repeated more than $10^5$ times.

2. A memory device of claim 1, in which the impurity concentrations of said bottom surface of said first polycrystalline silicon film of said floating gate electrode and said upper surface of said second polycrystalline silicon film of said floating gate electrode range from $10^{18}$ to $10^{19}$ cm$^{-3}$ and from $10^{20}$ to $10^{21}$ cm$^{-3}$, respectively.

3. An electrically programmable and erasable memory device of claim 1, in which the thickness of said first polycrystalline silicon film ranges from 500 Å to 3000 Å, and the thickness of said second polycrystalline silicon film ranges from 500 Å to 3000 Å.

* * * * *